(12) United States Patent
Zhang et al.

(10) Patent No.: US 11,237,656 B2
(45) Date of Patent: Feb. 1, 2022

(54) TOUCH DISPLAY PANEL AND ELECTRONIC DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Le Zhang, Beijing (CN); Yanyan Yin, Beijing (CN); Weixiong Chen, Beijing (CN); Xuchen Yuan, Beijing (CN); Hong Liu, Beijing (CN); Pengcheng Tian, Beijing (CN); Hanqing Liu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 251 days.

(21) Appl. No.: 16/613,560

(22) PCT Filed: May 9, 2019

(86) PCT No.: PCT/CN2019/086242
§ 371 (c)(1),
(2) Date: Nov. 14, 2019

(87) PCT Pub. No.: WO2019/218929
PCT Pub. Date: Nov. 21, 2019

(65) Prior Publication Data
US 2021/0342027 A1    Nov. 4, 2021

(30) Foreign Application Priority Data

May 18, 2018  (CN) .......................... 201810482309.7

(51) Int. Cl.
| | | |
|---|---|---|
| *G06F 3/041* | (2006.01) | |
| *G06F 3/044* | (2006.01) | |
| *G09G 3/36* | (2006.01) | |
| *G02F 1/1333* | (2006.01) | |

(52) U.S. Cl.
CPC ............ *G06F 3/0412* (2013.01); *G06F 3/044* (2013.01); *G09G 3/3614* (2013.01);
(Continued)

(58) Field of Classification Search
CPC ..... G06F 3/0412; G06F 3/044; G09G 3/3614; G02F 1/13338
(Continued)

(56) References Cited

U.S. PATENT DOCUMENTS

2006/0109222 A1* 5/2006 Lee .......................... G06F 3/042
345/88
2010/0201719 A1* 8/2010 Kimura .................. G09G 5/005
345/690
(Continued)

FOREIGN PATENT DOCUMENTS

| CN | 206178745 U | 5/2017 |
|---|---|---|
| CN | 106842736 A | 6/2017 |

(Continued)

*Primary Examiner* — Kwin Xie
(74) *Attorney, Agent, or Firm* — Dilworth & Barrese, LLP.; Michael J. Musella, Esq.

(57) ABSTRACT

A touch display panel and an electronic device are provided, the touch display panel includes a first data line, a second data line, a first touch line, a second touch line, a first sub-pixel column, a second sub-pixel column, a third sub-pixel column, and a fourth sub-pixel column. A distance from the first sub-pixel column to the first data line a right side of the first sub-pixel column is a first distance, a distance from the second sub-pixel column to the first data line on a left side of the second sub-pixel column is a second distance, and the first distance is smaller than the second (Continued)

distance. A distance from the third sub-pixel column to the second data line is a third distance, a distance from the fourth sub-pixel column to the second data line is a fourth distance, and the third distance is greater than the fourth distance.

20 Claims, 5 Drawing Sheets

(52) U.S. Cl.
CPC . *G02F 1/13338* (2013.01); *G09G 2300/0452* (2013.01); *G09G 2320/0233* (2013.01); *G09G 2320/0242* (2013.01)

(58) Field of Classification Search
USPC .................................................. 345/173–174
See application file for complete search history.

(56) References Cited

U.S. PATENT DOCUMENTS

| | | | | |
|---|---|---|---|---|
| 2012/0113154 | A1* | 5/2012 | Ge | G09G 3/3614 345/690 |
| 2018/0321782 | A1* | 11/2018 | Qin | G06F 3/047 |
| 2018/0321788 | A1* | 11/2018 | Kimura | G02F 1/133345 |
| 2020/0064669 | A1* | 2/2020 | Nishiyama | G06F 3/0443 |

FOREIGN PATENT DOCUMENTS

| | | |
|---|---|---|
| CN | 107179639 A | 9/2017 |
| CN | 107390441 A | 11/2017 |
| CN | 108732832 A | 11/2018 |
| KR | 100879478 B1 | 1/2009 |

\* cited by examiner

TOUCH DISPLAY PANEL AND ELECTRONIC DEVICE

CROSS-REFERENCE TO RELATED APPLICATIONS

The present application claims the priority of the Chinese Patent Application No. 201810482309.7 filed on May 18, 2018, the entire disclosure of which is hereby incorporated by reference.

TECHNICAL FIELD

Embodiments of the present disclosure relate to a touch display panel and an electronic device.

BACKGROUND

With the continuous development of the touch technology, the touch technology is increasingly used in display devices such as mobile phones, tablets, and notebook computers. At present, in a display device with a touch function, a touch and display driver integration (TDDI) technology can integrate a touch driver and a display driver into a chip, thereby achieving unified control of a touch operation and a display operation by the single chip. TDDI products have gradually become the mainstream of the market due to their low cost, light weight and thin, high sensitivity, fast response, and simple process.

SUMMARY

At least one embodiment of the present disclosure provides a touch display panel, the touch display panel comprises a plurality of sub-pixels arranged in a matrix, a plurality of data lines, and a plurality of touch lines, each of the plurality of touch lines and each of the plurality of data lines are in a same layer and insulated from each other; the plurality of data lines comprise a first data line and a second data line, the plurality of touch lines comprise a first touch line and a second touch line, the first data line and the first touch line are located between a first pair of adjacent sub-pixel columns, and the second data line and the second touch line are located between a second pair of adjacent sub-pixel columns; the first pair of adjacent sub-pixel columns comprises a first sub-pixel column and a second sub-pixel column, and the second pair of adjacent sub-pixel columns comprises a third sub-pixel column and a fourth sub-pixel column; the first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line; the first data line is connected to the second sub-pixel column, a distance from the second sub-pixel column to a data line located on a side of the second sub-pixel column away from the first data line is a first distance, a distance from the second sub-pixel column to the first data line is a second distance, and the first distance is smaller than the second distance; the second data line is connected to the fourth sub-pixel column, a distance from the third sub-pixel column to the second data line is a third distance, a distance from the third sub-pixel column to a data line which is connected to the third sub-pixel column and is located on a side of the third sub-pixel column away from the second data line is a fourth distance, and the third distance is greater than the fourth distance.

For example, in the touch display panel provided by one or more embodiments of the present disclosure, a distance from the first sub-pixel column to a data line which is connected to the first sub-pixel column and is located on a side of the first sub-pixel column away from the first data line is the first distance, and a distance from the first sub-pixel column to the first data line is the first distance. A distance from the fourth sub-pixel column to the second data line is the fourth distance, and a distance from the fourth sub-pixel column to a data line located on a side of the fourth sub-pixel column away from the second data line is the fourth distance.

For example, in the touch display panel provided by one or more embodiments of the present disclosure, a polarity inversion mode of the touch display panel is column inversion.

For example, in the touch display panel provided by one or more embodiments of the present disclosure, the first touch line is located on a side of the first data line away from the first sub-pixel column, and the second touch line is located on a side of the second data line away from the fourth sub-pixel column.

For example, in the touch display panel provided by one or more embodiments of the present disclosure, the touch display panel includes a plurality of first touch lines and a plurality of second touch lines, and the plurality of first touch lines and the plurality of second touch lines are alternately arranged in the row direction of the plurality of sub-pixels.

For example, in the touch display panel provided by one or more embodiments of the present disclosure, the first distance is equal to the fourth distance, and the second distance is equal to the third distance.

For example, in the touch display panel provided by one or more embodiments of the present disclosure, the touch display panel includes sub-pixels of a plurality of colors, and an arrangement of respective sub-pixels in the third sub-pixel column is identical to an arrangement of respective sub-pixels in the second sub-pixel column.

For example, in the touch display panel provided by one or more embodiments of the present disclosure, colors of respective sub-pixels located in a same column are identical, and colors of the respective sub-pixels in the second sub-pixel column are same as colors of the respective sub-pixels in the third sub-pixel column.

For example, in the touch display panel provided by one or more embodiments of the present disclosure, a sub-pixel in the first sub-pixel column and a sub-pixel in the third sub-pixel column which is in a same row as the sub-pixel in the first sub-pixel column have a same color, and a sub-pixel in the second sub-pixel column and a sub-pixel in the fourth sub-pixel column which is in a same row as the sub-pixel in the second sub-pixel column have a same color.

For example, in the touch display panel provided by one or more embodiments of the present disclosure, a sub-pixel in the first sub-pixel column and a sub-pixel in the second sub-pixel column which is in a same row as the sub-pixel in the first sub-pixel column have different colors, and a sub-pixel in the third sub-pixel column and a sub-pixel in the fourth sub-pixel column which is in a same row as the sub-pixel in the third sub-pixel column have different colors.

For example, in the touch display panel provided by one or more embodiments of the present disclosure, the touch display panel includes sub-pixels of a plurality of colors, at least one sub-pixel is provided between two sub-pixels having a same color in a column direction of the plurality of sub-pixels, and a color of the at least one sub-pixel is different from the same color of the two sub-pixels.

For example, in the touch display panel provided by one or more embodiments of the present disclosure, the touch display panel includes sub-pixels of a plurality of colors, at least one sub-pixel is provided between two sub-pixels having a same color in the row direction of the plurality of sub-pixels, and a color of the at least one sub-pixel is different from the same color of the two sub-pixels.

For example, in the touch display panel provided by one or more embodiments of the present disclosure, a distance from the first touch line to the first sub-pixel column is equal to the second distance, and a distance from the first touch line to the second sub-pixel column is equal to the first distance. A distance from the second touch line to the third sub-pixel column is equal to the fourth distance, and a distance from the second touch line to the fourth sub-pixel column is equal to the third distance.

For example, in the touch display panel provided by one or more embodiments of the present disclosure, at least one sub-pixel column is provided between the first pair of adjacent sub-pixel columns and the second pair of adjacent sub-pixel column.

For example, in the touch display panel provided by one or more embodiments of the present disclosure, the first distance is equal to the fourth distance, the touch display panel further includes two adjacent sub-pixel columns, only a data line is disposed between the two adjacent sub-pixel columns, and distances from the data line respectively to the two adjacent sub-pixel columns are the first distance.

At least one embodiment of the present disclosure also provides a touch display panel, the touch display panel comprises a plurality of sub-pixels arranged in a matrix, a plurality of data lines, and a plurality of touch lines, each of the plurality of touch lines and each of the plurality of data lines are in a same layer and insulated from each other; the plurality of data lines comprises a first data line and a second data line, the plurality of touch lines comprises a first touch line and a second touch line, the first data line and the first touch line are located between a first pair of adjacent sub-pixel columns, and the second data line and the second touch line are located between a second pair of adjacent sub-pixel columns; the first pair of adjacent sub-pixel columns comprises a first sub-pixel column and a second sub-pixel column, and the second pair of adjacent sub-pixel columns includes a third sub-pixel column and a fourth sub-pixel column; the first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line; the first data line is connected to the second sub-pixel column, a distance from the first sub-pixel column to the first data line is a first distance, a distance from the second sub-pixel column to the first data line is a second distance, and the first distance is smaller than the second distance; the second data line is connected to the fourth sub-pixel column, a distance from the third sub-pixel column to the second data line is a third distance, a distance from the fourth sub-pixel column to the second data line is a fourth distance, and the third distance is greater than the fourth distance.

For example, in the touch display panel provided by one or more embodiments of the present disclosure, a distance from the first sub-pixel column to a data line which is connected to the first sub-pixel column and is located on a side of the first sub-pixel column away from the first data line is the first distance, and a distance from the second sub-pixel column to a data line located on a side of the second sub-pixel column away from the first data line is the first distance.

For example, in the touch display panel provided by one or more embodiments of the present disclosure, a distance from the third sub-pixel column to a data line which is connected to the third sub-pixel column and is located on a side of the third sub-pixel column away from the second data line is the fourth distance, and a distance from the fourth sub-pixel column to a data line located on a side of the fourth sub-pixel column away from the second data line is the fourth distance.

At least one embodiment of the present disclosure also provides an electronic device including any one of the touch display panels described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
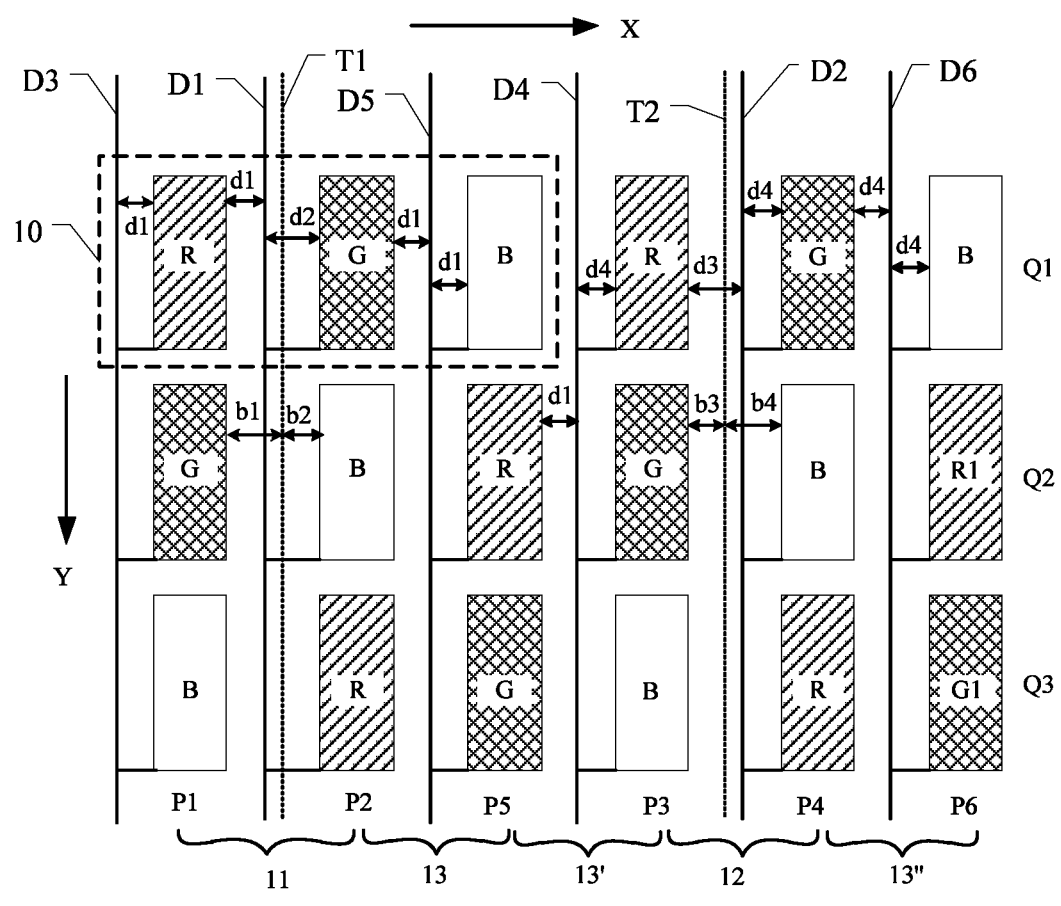
FIG. 1 is a schematic plane structure diagram of a touch display panel according to an embodiment of the present disclosure.

In order to make objects, technical details and advantages of the embodiments of the invention apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art may acquire other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first", "second", and the like, which are used in the present disclosure, are not intended to indicate any sequence, amount or importance, but distinguish various components. The terms "comprise", "comprising", "include", "including", and the like, are intended to specify that the elements stated before these terms encompass the elements listed after these terms, but do not preclude the other elements. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits detailed descriptions of known functions and known components.

The touch and display driver integration (TDDI) electronics may include hybrid in-cell (HIC) structures, full in cell (FIC) structures, and the like. The FIC product uses the single-layer touch trace design and uses the self-capacitance principle to achieve multi-touch. The FIC product integrates touch signals into the display panel. In the FIC product, a touch detection line for transmitting a touch signal is located on one side of a data signal line, thereby causing data signal lines on a left side and a right side of a certain pixel to be asymmetric, and coupling capacitors (Cpd) formed by a pixel electrode of a pixel and the data signal lines on both sides of the pixel are inconsistent, thereby affecting distribution of liquid crystal molecules around the pixel electrode, and affecting a display effect of the display panel.

At present, the touch display panel may include a red sub-pixel column, a green sub-pixel column, a blue sub-pixel column, a plurality of data lines, and a plurality of touch lines, and the plurality of data lines and the plurality of touch lines are disposed in the same layer. A touch detection line is located between the red sub-pixel column and the green sub-pixel column, that is, a touch detection line and a data line are disposed between the red sub-pixel column and the green sub-pixel column. The touch detection line may be located on a left side of the data line. Because the touch detection line and the data line are disposed between the red sub-pixel column and the green sub-pixel column, a distance between the red sub-pixel column and the data line connected to the red sub-pixel column is f1, and a distance between the red sub-pixel column and a data line adjacent to (physically directly adjacent to) the red sub-pixel column is f2, and f2 and f1 are different. For example, the touch detection line is disposed between the red sub-pixel column and the data line adjacent to the red sub-pixel column, such that f2 is greater than f1.

For example, a polarity inversion mode of the touch display panel is column inversion, if the red sub-pixel column includes M rows. For a grayscale picture, in a process of switching between two adjacent frames, when a data signal of a red sub-pixel in a first row becomes a data signal of a N-th frame, a data signal of a red sub-pixel in a M-th row (i.e. the last row along a scanning direction) also remains as a data signal of a (N−1)-th frame, that is, when the data signal on the red sub-pixel in the first row in the red sub-pixel column becomes a positive signal, the data signal on the red sub-pixel in the M-th row (hereinafter referred to as a target red sub-pixel) in the red sub-pixel column is a negative signal. For example, a coupling capacitance between the target red sub-pixel and a data line connected to the target red sub-pixel is Cpd1, and a coupling capacitance between the target red sub-pixel and a data line adjacent to the target red sub-pixel is Cpd2. Because f2 is greater than f1, according to the calculation formula of the capacitance, the coupling capacitance Cpd1 is greater than the coupling capacitance Cpd2. In the N-th frame, the data signal on the data line connected to the target red sub-pixel is the positive signal, and the data signal on the data line adjacent to the target red sub-pixel is the negative signal. Because the coupling pull of the data line connected to the target red sub-pixel to the data signal on the target red sub-pixel is greater than the coupling pull of the data line adjacent to the target red sub-pixel to the data signal on the target red sub-pixel, so the data signal on the target red sub-pixel is reduced (for example, from −5V to −4.9V), that is, the brightness of the target red sub-pixel is lowered, and a display picture at an end, where the M-th row is located, of the touch display panel is blue and dark, and significant difference in color and brightness between a first end and a last end of the touch display panel along a scanning direction occurs, affecting the display quality. The scanning direction is, for example, a column direction.

At least one embodiment of the present disclosure provides a touch display panel, the touch display panel comprises a plurality of sub-pixels arranged in a matrix, a plurality of data lines, and a plurality of touch lines, each of the plurality of touch lines and each of the plurality of data lines are in the same layer and insulated from each other. The plurality of data lines include a first data line and a second data line, the plurality of touch lines include a first touch line and a second touch line, the first data line and the first touch line are located between a first pair of adjacent sub-pixel columns, and the second data line and the second touch line are located between a second pair of adjacent sub-pixel columns. The first pair of adjacent sub-pixel columns includes a first sub-pixel column and a second sub-pixel column, and the second pair of adjacent sub-pixel columns includes a third sub-pixel column and a fourth sub-pixel column. The first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line. The first data line is connected to the second sub-pixel column, a distance from the second sub-pixel column to a data line located on a side of the second sub-pixel column away from the first data line is a first distance, a distance from the second sub-pixel column to the first data line is a second distance, and the first distance is smaller than the second distance. The second data line is connected to the fourth sub-pixel column, a distance from the third sub-pixel column to the second data line is a third distance, a distance from the third sub-pixel column to a data line which is connected to the third sub-pixel column and located on a side of the third sub-pixel column away from the second data line is a fourth distance, and the third distance is greater than the fourth distance.

At least one embodiment of the present disclosure also provides a touch display panel, and the touch display panel comprises a plurality of sub-pixels arranged in a matrix, a plurality of data lines, and a plurality of touch lines, each of the plurality of touch lines and each of the plurality of data lines are in the same layer and insulated from each other. The plurality of data lines include a first data line and a second data line, the plurality of touch lines include a first touch line and a second touch line, the first data line and the first touch line are located between a first pair of adjacent sub-pixel columns, and the second data line and the second touch line are located between a second pair of adjacent sub-pixel columns. The first pair of adjacent sub-pixel columns includes a first sub-pixel column and a second sub-pixel column, and the second pair of adjacent sub-pixel columns includes a third sub-pixel column and a fourth sub-pixel column. The first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line. The first data line is connected to the second sub-pixel column, a distance from the first sub-pixel column to the first data line is a first distance, a distance from the second sub-pixel column to the first data line is a second distance, and the first distance is smaller than the second distance. The second data line is connected to the fourth sub-pixel column, a distance from the third sub-pixel column to the second data line is a third distance, a distance from the fourth sub-pixel column to the second data line is a fourth distance, and the third distance is greater than the fourth distance.

The embodiments of the present disclosure provide a touch display panel and an electronic device. The touch display panel controls a distance relationship between the sub-pixel column and the data lines adjacent to two sides of the sub-pixel column, so that the difference in pixel brightness caused by the coupling capacitances between the data lines and the pixel electrodes can be neutralized, thereby ameliorating the display color difference between the front end and rear end of the display panel and improving the display quality. In addition, the touch display panel can also effectively avoid a problem of cross-color, the design of the touch display panel does not need to increase the mask, the process is simple, and the cost is low.

The embodiments of the present disclosure are described in detail below, but the present disclosure is not limited to the specific embodiments.

FIG. 1 is a schematic plane structure diagram of a touch display panel according to an embodiment of the present disclosure. As shown in FIG. 1, a touch display panel provided by the embodiment of the present disclosure may include a plurality of sub-pixels arranged in a matrix, a plurality of data lines (for example, data lines D1-D6 shown in FIG. 1), and a plurality of touch lines (for example, touch lines T1-T2 shown in FIG. 1).

For example, as shown in FIG. 1, the plurality of sub-pixels are arranged in the matrix along a row direction X and a column direction Y, that is, the touch display panel includes a plurality of sub-pixel columns (a first sub-pixel column P1 to a sixth sub-pixel column P6 shown in FIG. 1). Of course, it may also be considered that the touch display panel includes a plurality of sub-pixel rows (a first sub-pixel row Q1 to a third sub-pixel row Q3 shown in FIG. 1).

For example, the data lines are located among the sub-pixel columns, and the touch lines are also located among the sub-pixel columns. For example, the touch lines are located among portion sub-pixel columns. The data lines and the touch lines extend in the same direction. For example, the data lines and the touch lines extend along the column direction Y of the sub-pixels. In the embodiment of the present disclosure, a sub-pixel column refers to sub-pixels arranged in a column, and a sub-pixel row refers to sub-pixels arranged in a row.

For example, as shown in FIG. 1, the touch display panel includes a first pair of adjacent sub-pixel columns 11 and a second pair of adjacent sub-pixel columns 12. The plurality of data lines include a first data line D1 and a second data line D2. The plurality of touch lines include a first touch line T1 and a second touch line T2. The first data line D1 and the first touch line T1 both are located between the first pair of adjacent sub-pixel columns 11, and the second data line D2 and the second touch line T2 both are located between the second pair of adjacent sub-pixel columns 12.

For example, the first touch line T1 and the second touch line T2 may be adjacent two touch lines. It should be noted that, in the embodiment of the present disclosure, "the adjacent two touch lines" does not mean that the two touch lines are directly adjacent to each other in the physical position, but indicates that there is no other touch line between the two touch lines.

For example, the first pair of adjacent sub-pixel columns 11 includes a first sub-pixel column P1 and a second sub-pixel column P2, and the second pair of adjacent sub-pixel columns 12 includes a third sub-pixel column P3 and a fourth sub-pixel column P4.

For example, the first data line D1 is connected to the second sub-pixel column P2 on a right side of the first data line D1. A distance from the first sub-pixel column P1 to the first data line D1 on a right side of the first sub-pixel column P1 is a first distance d1, and a distance from the second sub-pixel column P2 to the first data line D1 is a second distance d2.

For example, the second data line D2 is connected to the fourth sub-pixel column P4 on a right side of the second data line D2. A distance from the third sub-pixel column P3 to the second data line D2 on a right side of the third sub-pixel column P3 is a third distance d3, and a distance from the fourth sub-pixel column P4 to the second data line D2 is a fourth distance d4.

For example, the first distance d1 is smaller than the second distance d2, and the third distance d3 is larger than the fourth distance d4.

For example, a distance from the first sub-pixel column P1 to a data line which is connected to the first sub-pixel column P1 and is located on a left side of the first sub-pixel column P1 is the first distance d1, and a distance from the second sub-pixel column P2 to a data line on a right side of the second sub-pixel column P2 is the first distance d1. For example, a distance from the third sub-pixel column P3 to a data line which is connected to the third sub-pixel column P3 and is located on a left side of the third sub-pixel column P3 is the fourth distance d4, and a distance from the fourth sub-pixel column P4 to a data line on a right side of the fourth sub-pixel column P4 is the fourth distance d4.

For example, as shown in FIG. 1, the first touch line T1 is located on the right side of the first data line D1, and the second touch line T2 is located on the left side of the second data line D2. Therefore, in the touch display panel, the touch lines are left-right-alternately arranged on left sides and right side of the data lines adjacent to the touch lines, thereby neutralizing the difference in pixel brightness caused by the coupling capacitance between the data lines and the pixel electrodes, ameliorating the display color difference between the front end and rear end of the display panel, and improving the display quality. On the other hand, because the first distance d1 is smaller than the second distance d2, and the third distance d3 is greater than the fourth distance d4, so that the structure between the sub-pixels can be more compact, and the aperture ratio of the sub-pixels is improved.

For example, the first touch line T1 and the first data line D1 are located in the same layer, and the second touch line T2 and the second data line D2 are located in the same layer.

For example, the respective data lines (i.e., the first data line D1 to the sixth data line D6) are also located in the same layer. That is, the respective data lines and the respective touch lines are located in the same layer, and the touch lines and the data lines are insulated from each other. For example, in the embodiments of the present disclosure, the data lines (for example, the first data line D1 to the sixth data line D6) and the touch lines (for example, the first touch line T1 and the second touch line T2) can be prepared by the same patterning process, so that no mask is required to be added, and a manufacturing process for the touch display panel is simple. However, the present disclosure is not limited thereto, the first data line D1 and the second data line D2, for example, may be located on different layers.

For example, as shown in FIG. 1, the row direction X of the sub-pixels and the column direction Y of the sub-pixels may be perpendicular to each other.

For example, a plurality of sub-pixels in the touch display panel may be sub-pixels of the same color. In this case, the touch display panel may be a monochrome display panel, and the plurality of sub-pixels may all be white sub-pixels, that is, the touch display panel displays two colors of black and white. For example, the touch display panel may include a monochrome display panel such as a tablet, a reader, or the like.

For example, the touch display panel may also include sub-pixels of a plurality of colors, that is, colors of at least some sub-pixels of the plurality of sub-pixels are different. As shown in FIG. 1, the touch display panel may include a first color sub-pixel R, a second color sub-pixel G, and a third color sub-pixel B.

For example, the first color sub-pixel R, the second color sub-pixel G, and the third color sub-pixel B constitute a pixel 10 on the touch display panel, that is, each pixel 10 on the touch display panel may include three sub-pixels.

For example, the first color sub-pixel R is a red sub-pixel, the second color sub-pixel G is a green sub-pixel, and the third color sub-pixel B is a blue sub-pixel. However, the present disclosure is not limited thereto, and the first color sub-pixel may also be a cyan sub-pixel, the second color sub-pixel may also be a magenta sub-pixel, and the third color sub-pixel may also be a yellow sub-pixel. For another example, each pixel 10 may also include four sub-pixels, and the four sub-pixels are, for example, a red sub-pixel, a green sub-pixel, a blue sub-pixel, and a white sub-pixel. In the following description of the present disclosure, the present disclosure will be described in detail by taking each pixel 10 including a red sub-pixel, a green sub-pixel, and a blue sub-pixel as an example.

It should be noted that FIG. 1 exemplarily shows the sub-pixels arranged in three rows and six columns, and each sub-pixel column includes only three sub-pixels. However, the present disclosure is not limited thereto, the touch display panel may include sub-pixels arranged in M rows and N columns, and each sub-pixel column includes M sub-pixels.

For example, a shape of the first color sub-pixel R, a shape of the second color sub-pixel G and a shape of the third color sub-pixel B may be the same, such as a rectangle or the like. Of course, the shapes of the sub-pixels of respective colors may also be different, may be set according to a specific situation, and are not limited herein.

For example, in the column direction Y of the sub-pixels, the colors of the respective sub-pixels located in the same column may be the same, thereby decreasing complexity of a scanning algorithm, simplifying a driving process, and reducing power consumption. For example, colors of the respective sub-pixels in the second sub-pixel column P2 and colors of the respective sub-pixels in the third sub-pixel column P3 are the same. For example, the respective sub-pixels in the second sub-pixel column P2 are the red sub-pixels, and correspondingly, the respective sub-pixels in the third sub-pixel column P3 are also the red sub-pixels.

For example, in the column direction Y of the sub-pixels, the colors of at least part sub-pixels of the sub-pixels located in the same column may be different, and the sub-pixels of the same color may not be adjacent in the row direction X of the sub-pixels. As shown in FIG. 1, for the second color sub-pixel G, in the column direction Y of the sub-pixels, two sub-pixels adjacent to the second color sub-pixel G are the first color sub-pixel R and the third color sub-pixel B, respectively. The first color sub-pixel R is located above the second color sub-pixel G, and the third color sub-pixel B is located below the second color sub-pixel G.

For example, in some embodiments, an arrangement of the respective sub-pixels in the third sub-pixel column P3 and an arrangement of the respective sub-pixels in the second sub-pixel column P2 may be the same. In the second sub-pixel column P2 and the third sub-pixel column P3, both of the arrangements of the sub-pixels are RGBRGB. It should be noted that "arrangement" indicates an arrangement of sub-pixels of different colors.

For example, in some other embodiments, the arrangement of the respective sub-pixels in the third sub-pixel column P3 and the arrangement of the respective sub-pixels in the second sub-pixel column P2 may also be different. As shown in FIG. 1, an arrangement of the respective sub-pixels in the first sub-pixel column P1 and an arrangement of the respective sub-pixels in the third sub-pixel column P3 are the same, and an arrangement of the respective sub-pixels in the second sub-pixel column P2 and an arrangement of the respective sub-pixels in the fourth sub-pixel column P4 are the same. For example, as shown in FIG. 1, in the first sub-pixel column P1 and the third sub-pixel column P3, both of the arrangements of the sub-pixels are RGBRGB. In the second sub-pixel column P2 and the fourth sub-pixel column P4, both of the arrangements of the sub-pixels are GBRGBR.

For example, in the row direction X of the sub-pixels, colors of respective sub-pixels located in the same row may be the same.

For example, in the row direction X of the sub-pixels, colors of at least some sub-pixels of the sub-pixels located in the same row may be the different. The sub-pixels of the same color may not be adjacent in the row direction X of the sub-pixels. As shown in FIG. 1, for the first color sub-pixel R, in the row direction X of the sub-pixels, two sub-pixels adjacent to the first color sub-pixel R are a second color sub-pixel G and a third color sub-pixel B, respectively. The second color sub-pixel G may be located at the right side of the first color sub-pixel R, and the third color sub-pixel B may be located at the left side of the first color sub-pixel R.

In summary, in the row direction X and the column direction Y of the sub-pixels, colors of four sub-pixels adjacent to the first color sub-pixel R and having a side opposite to the first color sub-pixel R are different from a color of the first color sub-pixel R.

For example, in the row direction X of the sub-pixels, there may be at least one sub-pixel between the two sub-pixels of the same color, the color of the at least one sub-pixel is different from the colors of the two sub-pixels. For example, as shown in FIG. 1, in the row direction X of the sub-pixels, a second color sub-pixel G and a third color sub-pixel B are provided between the adjacent two first color sub-pixels R. A first color sub-pixel R and a third color sub-pixel B are provided between the adjacent two second color sub-pixels G. A first color sub-pixel R and a second color sub-pixel G are provided between the adjacent two third color sub-pixels B.

For example, in the column direction Y of the sub-pixels, at least one sub-pixel is provided between the two sub-pixels of the same color, the color of the at least one sub-pixel is different from the colors of the two sub-pixels. For example, in the column direction Y of the sub-pixels, a second color sub-pixel G and a third color sub-pixel B are provided between the adjacent two first color sub-pixels R. A first color sub-pixel R and a third color sub-pixel B are provided between the adjacent two second color sub-pixels G. A first color sub-pixel R and a second color sub-pixel G are provided between the adjacent two third color sub-pixels B.

For example, as shown in FIG. 1, for the first color sub-pixel R, a first color sub-pixel R in the first sub-pixel column P1 and a first color sub-pixel R in the third sub-pixel column P3 are both located in a first sub-pixel row Q1, a first color sub-pixel R in the second sub-pixel column P2 and a first color sub-pixel R in the fourth sub-pixel column P4 are both located in a third sub-pixel row Q3, and a first color sub-pixel R in a fifth sub-pixel column P5 and a first color sub-pixel R in a sixth sub-pixel column P6 are both located in a second sub-pixel row Q2, that is, the first color sub-pixels R are arranged in a staggered mode. As shown in FIG. 1, similar to the first color sub-pixels R, the second color sub-pixels G o are also arranged in a staggered mode, and the third color sub-pixels B are also arranged in a staggered mode. For example, in the first sub-pixel row Q1, the arrangement of the sub-pixels is RGBRGB; in the second sub-pixel row Q2, the arrangement of the sub-pixels is GBRGBR; and in the third sub-pixel row Q3 the arrangement of the sub-pixels is BRGBRG.

For example, as shown in FIG. 1, a sub-pixel in the first sub-pixel column P1 and a sub-pixel in the third sub-pixel column P3 which is in the same row as the sub-pixel in the first sub-pixel column P1 have the same color, and a sub-pixel in the second sub-pixel column P2 and a sub-pixel in the fourth sub-pixel column P4 which is in the same row as the sub-pixel in the second sub-pixel column P2 have the same color. For example, as shown in FIG. 1, in a sub-pixel first row, a color of a sub-pixel in the first sub-pixel column P1 and a color of a sub-pixel in the third sub-pixel column P3 are both red. In a sub-pixel second row, a color of a sub-pixel in the first sub-pixel column P1 and a color of a sub-pixel in the third sub-pixel column P3 are both green. In a sub-pixel third row, a color of a sub-pixel in the first sub-pixel column P1 and a color of a sub-pixel in the third sub-pixel column P3 are both blue.

For example, as shown in FIG. 1, a sub-pixel in the first sub-pixel column P1 and a sub-pixel in the second sub-pixel column P2 which is in the same row as the sub-pixel in the first sub-pixel column P1 have different colors. For example, as shown in FIG. 1, in the sub-pixel first row, a color of a sub-pixel in the first sub-pixel column P1 and a color of a sub-pixel in the second sub-pixel column P2 are respectively red and green. In the sub-pixel second row, a color of a sub-pixel in the first sub-pixel column P1 and a color of a sub-pixel in the second sub-pixel column P2 are respectively green and blue. In the sub-pixel third row, a color of a sub-pixel in the first sub-pixel column P1 and a color of a sub-pixel in the second sub-pixel column P2 are respectively blue and red.

For example, as shown in FIG. 1, a sub-pixel in the third sub-pixel column P3 and a sub-pixel in the fourth sub-pixel column P4 which is in the same row as the sub-pixel in the third sub-pixel column P3 have different colors. For example, as shown in FIG. 1, in the sub-pixel first row, a color of a sub-pixel in the third sub-pixel column P3 and a color of a sub-pixel in the fourth sub-pixel column P4 are respectively red and green. In the sub-pixel second row, a color of a sub-pixel in the third sub-pixel column P3 and a color of a sub-pixel in the fourth sub-pixel column P4 are respectively green and blue. In the sub-pixel third row, a color of a sub-pixel in the third sub-pixel column P3 and a color of a sub-pixel in the fourth sub-pixel column P4 are respectively blue and red.

It should be noted that "two sub-pixels of the same color" may represent two adjacent sub-pixels of the same color. In this case, the two adjacent sub-pixels of the same color in the row direction X (and/or column direction Y) of the sub-pixels do not indicate that the physical positions of the two adjacent sub-pixels in the row direction X (and/or the column direction Y) are directly adjacent, but indicate that there is no other sub-pixel which has the same color as the two adjacent sub-pixels between the two adjacent sub-pixels in the row direction X, and sub-pixels of other colors may be inserted between the two adjacent sub-pixels. For example, there is no first color sub-pixel R between two adjacent first color sub-pixels R in the same row (and/or the same column), but sub-pixels of other colors, such as the second color sub-pixel G and the third color sub-pixel B, may be provided between the two adjacent first color sub-pixels R in the same row (and/or the same column).

For example, the sub-pixels of the same color in the two adjacent sub-pixel rows are disposed obliquely with respect to an edge of the touch display panel, and the sub-pixels of the same color in the two adjacent sub-pixel columns are disposed obliquely with respect to an edge of the touch display panel. That is, a line connecting centers of the sub-pixels of the same color in the two adjacent sub-pixel rows is not parallel to the row direction X and the column direction Y of the sub-pixels, and a line connecting centers of the sub-pixels of the same color in the two adjacent sub-pixel columns is not parallel to the row direction X and the column direction Y of the sub-pixels.

It should be noted that "two adjacent sub-pixel rows" indicates that two sub-pixel rows are directly adjacent in physical position, that is, there are no other sub-pixel rows between the two adjacent sub-pixel rows. Similarly, "two adjacent sub-pixel columns" indicates that two sub-pixel rows are directly adjacent in physical position, that is, there is no other sub-pixel columns between the two adjacent sub-pixel columns.

In summary, by staggering the sub-pixels of the same color in the adjacent rows and also staggering the sub-pixels of the same color in the adjacent columns, the touch display panel can effectively avoid the end color shift problem of the touch display panel in the scanning direction.

For example, one sub-pixel column is connected to one data line. The data line is used to provide data signals for the respective sub-pixels in the sub-pixel column connected to the data line. For example, as shown in FIG. 1, the touch display panel may further include a fifth sub-pixel column P5 and a sixth sub-pixel column P6, and the plurality of data lines further include a third data line D3, a fourth data line D4, a fifth data line D5, and a sixth data line D6. As shown in FIG. 1, the first sub-pixel column P1, the second sub-pixel column P2, the fifth sub-pixel column P5, the third sub-pixel column P3, the fourth sub-pixel column P4, and the sixth sub-pixel column P6 are sequentially arranged. The third data line D3 is connected to the first sub-pixel column P1 located on the right side of the third data line D3, the fourth data line D4 is connected to the third sub-pixel column P3 located on the right side of the fourth data line D4, the fifth data line D5 is connected to the fifth sub-pixel column P5 located on the right side of the fifth data line D5, and the sixth data line D6 is connected to the sixth sub-pixel column P6 located on the right side of the sixth data line D6. In this way, as shown in FIG. 1, the distance from the first sub-pixel column P1 to the third data line D3 on the left side of the first sub-pixel column P1 is the first distance d1, and the distance from the second sub-pixel column P2 to the fifth data line D5 on the right side of the second sub-pixel column P2 is also the first distance d1. The distance from the third sub-pixel column P3 to the fourth data line D4 on the left side of the third sub-pixel column P3 is the fourth distance d4, and the distance from the fourth sub-pixel column P4 to the sixth data line D6 on the right side of the fourth sub-pixel column P4 is also the fourth distance d4.

For example, the first distance d1 may be equal to the fourth distance d4, and the second distance d2 may be equal to the third distance d3, thereby simplifying the arrangement of the signal lines and facilitating the fabrication of the touch display panel.

It should be noted that, in the embodiments of the present disclosure, "left side" and "right side" may indicate the left side and the right side of the data lines in a case where leading ends of the data lines (such as the first data line D1 to the sixth data line D6) are located below. For example, as shown in FIG. 1, in a case where the leading ends of the data lines are located below, that is, in a case where the leading ends of the data lines are located on the side of the third sub-pixel row Q3 away from the second sub-pixel row Q2, the first sub-pixel column P1 is located on the left side of the first data line D1 and the second sub-pixel column P2 is located on the right side of the first data line D1 as viewed from the leading ends of the data lines toward the extending direction of the data lines. However, the present disclosure is not limited thereto, and "left side" and "right side" may also indicate the left side and the right side of the data lines in a case where the leading ends of the data lines (such as the first data line D1 to the sixth data line D6) are located above. For example, as shown in FIG. 1, in a case where the leading ends of the data lines are located above, that is, in a case where the leading ends of the data lines are located on the side of the first sub-pixel row Q1 away from the second sub-pixel row Q2, the first sub-pixel column P1 is located on the right side of the first data line D1 and the second sub-pixel column P2 is located on the left side of the first data line D1 as viewed from the leading ends of the data lines toward the extending direction of the data lines. The embodiments of the present disclosure are described in detail by taking a case that "right side" and "left side" indicate the right side and the left side of the data lines in a case where the leading ends of the data lines are located above as an example.

Figure 3A:
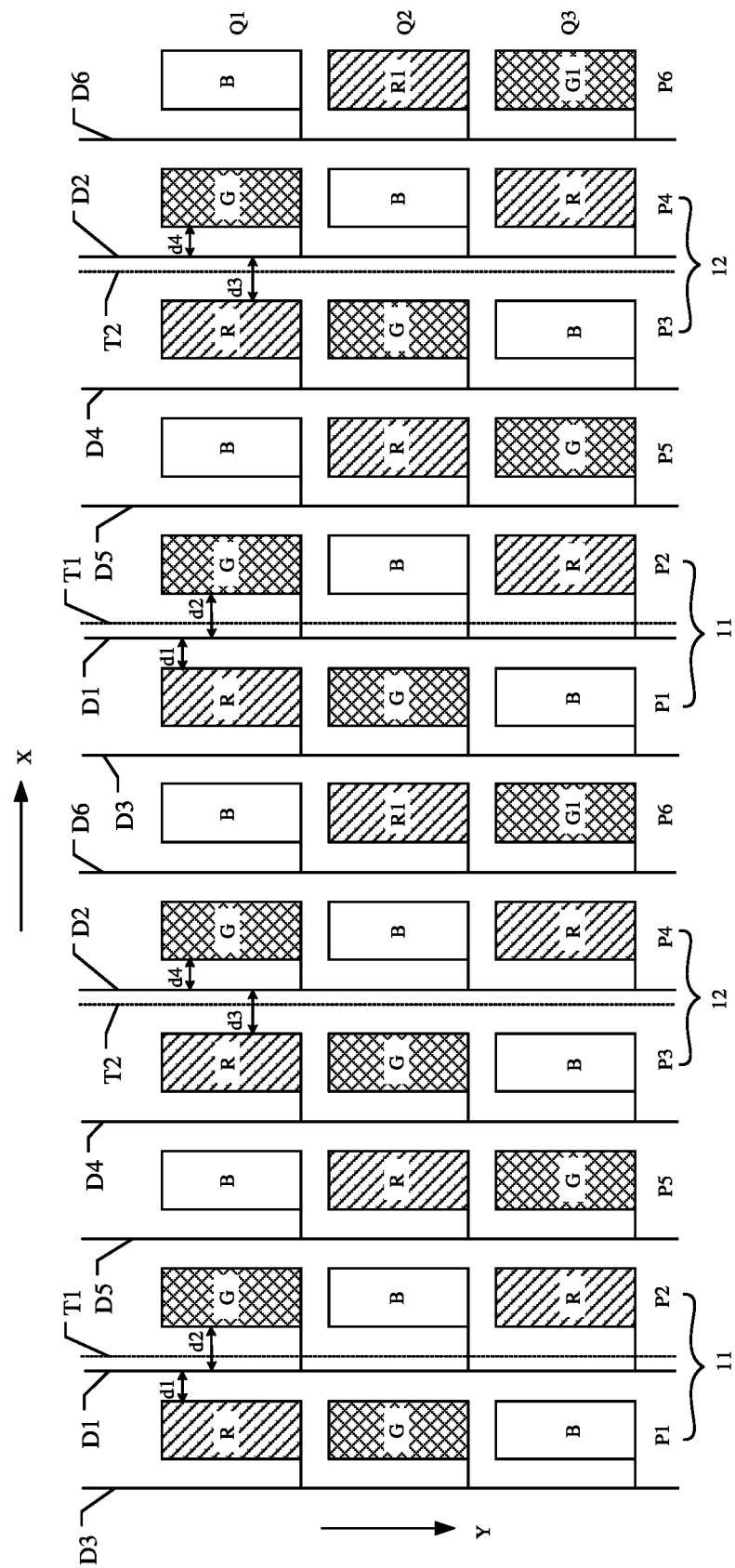
FIG. 3A is a schematic diagram illustrating a plane arrangement of a touch display panel according to an embodiment of the present disclosure.
Figure 3B:
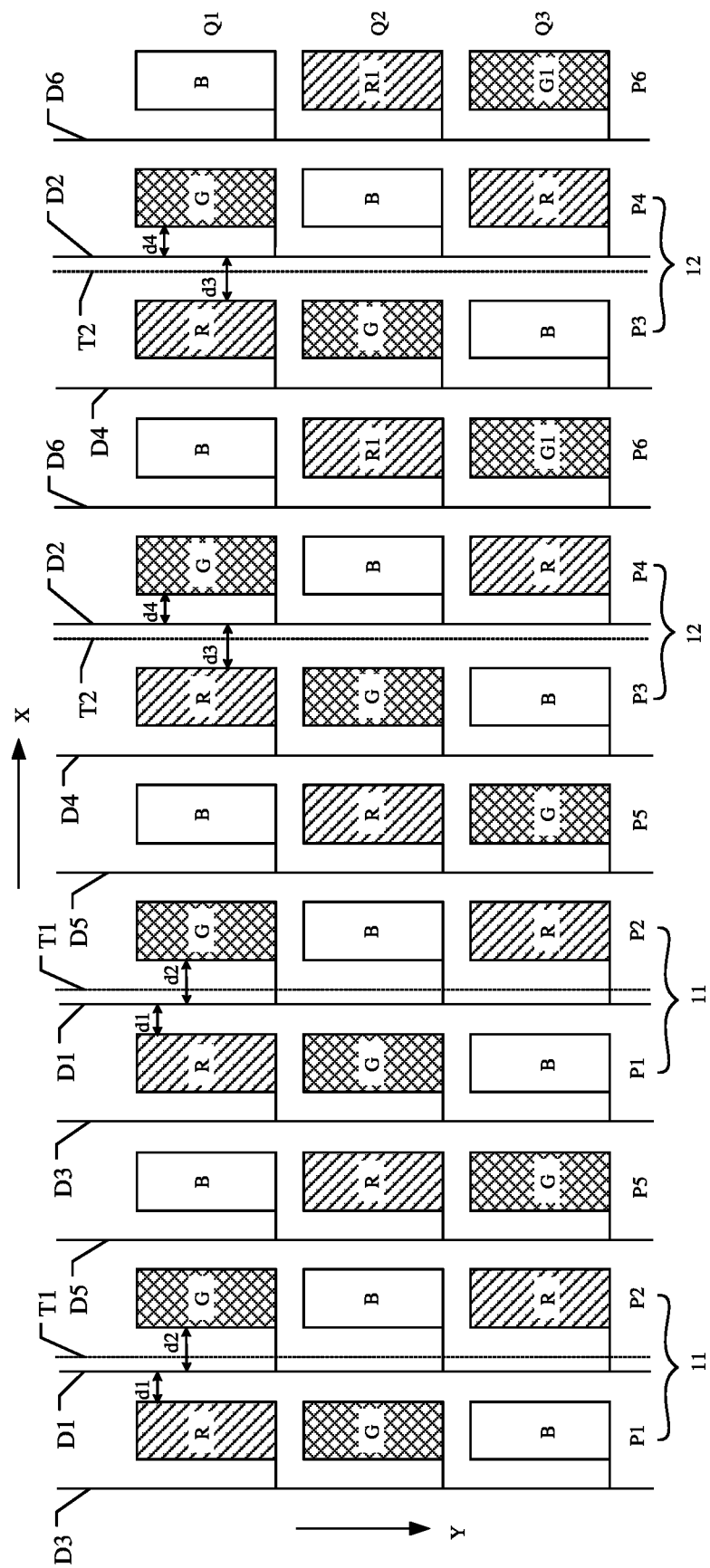
FIG. 3B is a schematic diagram illustrating a plane arrangement of another touch display panel according to an embodiment of the present disclosure.

FIG. 3A is a schematic diagram of a plane arrangement of a touch display panel provided by an embodiment of the present disclosure, and FIG. 3B is a schematic diagram of a plane arrangement of another touch display panel provided by an embodiment of the present disclosure.

For example, as shown in FIG. 3A, in a row direction X of sub-pixels, a plurality of first touch lines T1 and a plurality of second touch lines T2 are alternately arranged. However, the present disclosure is not limited thereto, for example, as shown in FIG. 3B, two first touch lines T1 form a first touch line group, and two second touch lines T2 form a second touch line group. In the row direction X of the sub-pixels, a plurality of first touch line groups and a plurality of second touch line groups are alternately arranged. The touch lines can be evenly arranged on the display panel, thereby simplifying the arrangement of the signal lines.

It should be noted that an arrangement of the first touch lines and the second touch lines shown in FIG. 3A and FIG. 3B is merely illustrative and not limiting. The specific arrangement of the first touch lines and the second touch lines may be designed according to actual needs. For example, a plurality of first touch lines (such as three, etc.) may constitute a first touch line group, and a plurality of second touch lines (such as three, etc.) may constitute a second touch line group, and in the row direction X of the sub-pixels, a plurality of first touch line groups and a plurality of second touch line groups are alternately arranged.

For example, as shown in FIG. 1, the touch display panel further includes two adjacent sub-pixel columns between which only a data line is disposed, and the distances from the data line respectively to the two adjacent sub-pixel columns are equal, and both are the first distance or the fourth distance. For example, in the embodiments of the present disclosure, the two sub-pixel columns, which are adjacent to each other and between which only a data line is disposed (that is, no touch line is disposed between the two sub-pixel columns), may be represented as a third pair of adjacent sub-pixel columns. As shown in FIG. 1, the second sub-pixel column P2 and the fifth sub-pixel column P5 may constitute a third pair of adjacent sub-pixel columns 13. The second sub-pixel column P2 may be shared by a first pair of adjacent sub-pixel columns 11 and a third pair of adjacent sub-pixel columns 13, that is, the second sub-pixel column P2 is one sub-pixel column of the first pair of adjacent sub-pixel columns 11 and is also one sub-pixel column of the third pair of adjacent sub-pixel columns 13. Similarly, the fifth sub-pixel column P5 and the third sub-pixel column P3 may also constitute a third pair of adjacent sub-pixel columns 13', and the fourth sub-pixel column P4 and the sixth sub-pixel column P6 may also constitute a third pair of adjacent sub-pixel columns 13".

For example, as shown in FIG. 1, in the third pair of adjacent sub-pixel columns 13, in the row direction X of the sub-pixels, a distance from the fifth sub-pixel column P5 to the fifth data line D5 on the left side of the fifth sub-pixel column P5 is equal to a distance from the fifth sub-pixel column P5 to the fourth data line D4 on the right side of the fifth sub-pixel column P5, and both are the first distance d1. In the third pair of adjacent sub-pixel columns 13", in the row direction X of the sub-pixels, a distance from the sixth sub-pixel column P6 to the sixth data line D6 on the left side of the sixth sub-pixel column P6 is the fourth distance d4.

For example, the first distance d1 and the fourth distance d4 are equal, such that the distance from the first sub-pixel column P1 to the third data line D3, the distance from the first sub-pixel column P1 to the first data line D1, the distance from the second sub-pixel column P2 to the fifth data line D5, the distance from the third sub-pixel column P3 to the fourth data line D4, the distance from the fourth sub-pixel column P4 to the second data line D2, the distance from the fourth sub-pixel column P4 to the sixth data line D6, the distance from the fifth sub-pixel column P5 to the fourth data line D4, the distance from the fifth sub-pixel column P5 to the fifth data line D5, and the distance from the sixth sub-pixel column P6 to the sixth data line D6 are all equal.

It should be noted that, at least part of the distance from the first sub-pixel column P1 to the third data line D3, the distance from the first sub-pixel column P1 to the first data line D1, the distance from the second sub-pixel column P2 to the fifth data line D5, the distance from the third sub-pixel column P3 to the fourth data line D4, the distance from the fourth sub-pixel column P4 to the second data line D2, the distance from the fourth sub-pixel column P4 to the sixth data line D6, the distance from the fifth sub-pixel column P5 to the fourth data line D4, the distance from the fifth sub-pixel column P5 to the fifth data line D5, and the distance from the sixth sub-pixel column P6 to the sixth data line D6 may also be not equal, however the present disclosure is not limited thereto. For example, the distance from the first sub-pixel column P1 to the third data line D3, the distance from the first sub-pixel column P1 to the first data line D1, the distance from the second sub-pixel column P2 to the fifth data line D5, the distance from the third sub-pixel column P3 to the fourth data line D4, the distance from the fourth sub-pixel column P4 to the second data line D2, the distance from the fourth sub-pixel column P4 to the sixth data line D6, the distance from the fifth sub-pixel column P5 to the fourth data line D4, the distance from the fifth sub-pixel column P5 to the fifth data line D5, and the distance from the sixth sub-pixel column P6 to the sixth data line D6 are all smaller than any of the second distance d2 and the third distance d3.

It should be noted that the distance from the fifth data line D5 to the second sub-pixel column P2 located on the left side of the fifth data line D5 and the distance from the fifth data line D5 to the fifth sub-pixel column P5 located on the right side of the fifth data line D5 may not be equal, but the distance from the fifth data line D5 to the fifth sub-pixel column P5 located on the right side of the fifth data line D5 and the distance from the fourth data line D4 to the fifth sub-pixel column P5 located on the left side of the fourth data line D4 are equal. For example, a data line located on the right side of the sixth sub-pixel column P6 and adjacent to the sixth sub-pixel column P6 may be a seventh data line (not shown), and the distance from the sixth data line D6 to the fourth sub-pixel column P4 located on the left side of the sixth data line D6 and the distance from the sixth data line D6 to the sixth sub-pixel column P6 located on the right side of the sixth data line D6 may also be not equal, but the distance from the sixth data line D6 to the sixth sub-pixel column P6 located on the right side of the sixth data line D6 and the distance from the seventh data line to the sixth sub-pixel column P6 located on the left side of the seventh data line are equal. It should be noted that "the seventh data line adjacent to the sixth sub-pixel column P6" indicates that there is no other data line between the seventh data line and the sixth sub-pixel column P6.

For example, in some embodiments, the second distance d2 from the first data line D1 to the second sub-pixel column P2 may also be smaller than the distance from the fifth data line D5 to the second sub-pixel column P2, and the third distance d3 from the second data line D2 to the third sub-pixel column P3 may also be smaller than the distance from the fourth data line D4 to the third sub-pixel column P3.

For example, the polarity inversion mode of the touch display panel provided by the embodiments of the present disclosure is column inversion. The plurality of data lines may include two adjacent data lines. One of the two adjacent data lines is configured to transmit a data signal of a first polarity in a first frame and a data signal of a second polarity in a second frame; another one of the two adjacent data lines is configured to transmit a data signal of the second polarity in the first frame and a data signal of the second polarity in the first frame. The first polarity and the second polarity are opposite to each other. The first frame and the second frame are adjacent to each other.

It should be noted that, "the two adjacent data lines" do not mean that two data line are directly adjacent to each other in the physical position, but indicates that there is no other data line between the two adjacent data lines.

For example, the first polarity is negative and the second polarity is positive; or the first polarity is positive and the second polarity is negative.

For example, a polarity of a data signal transmitted by the first data line D1 in the first frame is opposite to a polarity of a data signal transmitted by the first data line D1 in the second frame; a polarity of a data signal transmitted by the second data line D2 in the first frame is opposite to a polarity of a data signal transmitted by the second data line D2 in the second frame. If the data signal transmitted by the first data line D1 is a negative signal in the first frame, the data signal transmitted by the first data line D1 is a positive signal in the second frame, thereby preventing liquid crystal polarization.

For example, in the same frame, the data signals transmitted by the two adjacent data lines have opposite polarities. As shown in FIG. 1, the first data line D1 and the third data line D3 are adjacent to each other, the first data line D1 and the fifth data line D5 are also adjacent, the second data line D2 and the fourth data line D4 are adjacent to each other, and the second data line D2 and the sixth data line D6 are also adjacent. The polarity of the data signal transmitted by the first data line D1 is opposite to the polarity of the data signal transmitted by the third data line D3, and the polarity of the data signal transmitted by the first data line D1 is opposite to the polarity of the data signal transmitted by the fifth data line D5. The polarity of the data signal transmitted by the second data line D2 is opposite to the polarity of the data signal transmitted by the fourth data line D4, and the polarity of the data signal transmitted by the second data line D2 is opposite to the polarity of the data signal transmitted by the sixth data line D6.

For example, as shown in FIG. 1, in the same frame, the data signals transmitted by the first data line D1 and the second data line D2 have opposite polarities. The polarity of the data signal transmitted by the second data line D2, the polarity of the data signal transmitted by the third data line D3, and the polarity of the data signal transmitted by the fifth data line D5 are all the same, and the polarity of the data signal transmitted by the first data line D1, the polarity of the data signal transmitted by the fourth data line D4, and the polarity of the data signal transmitted by the sixth data line D6 are all the same.

Figure 2:
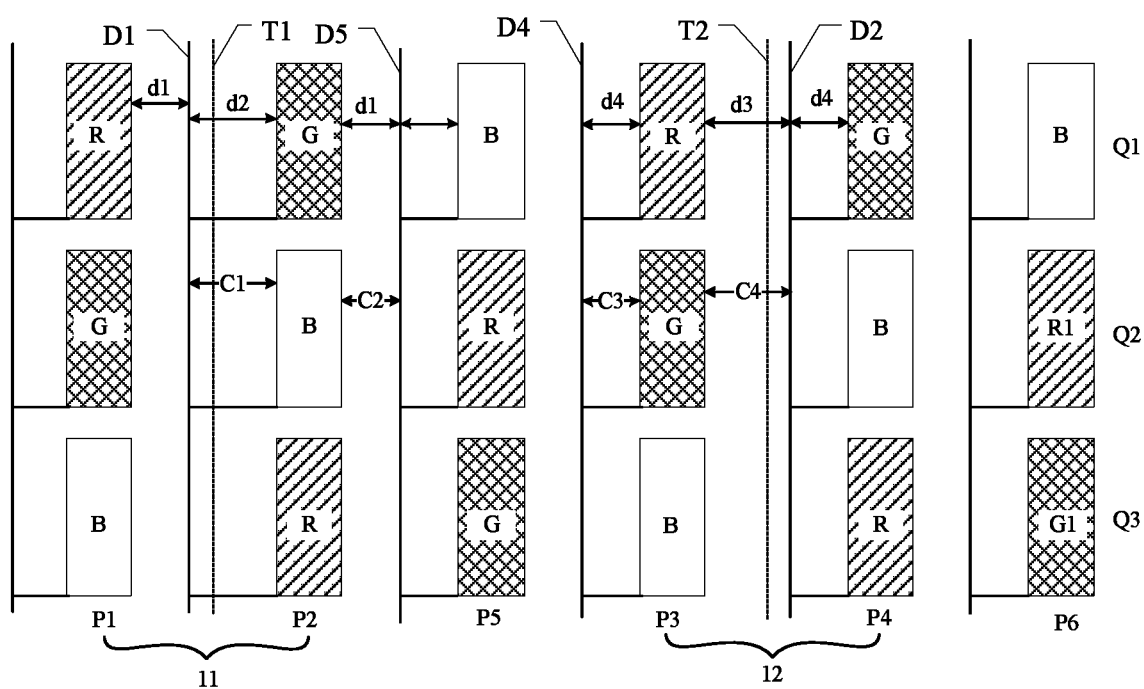
FIG. 2 is a schematic diagram of coupling capacitors formed between data lines and sub-pixels of the touch display panel shown in FIG. 1.

FIG. 2 is a schematic diagram of coupling capacitors formed between data lines and sub-pixels of the touch display panel shown in FIG. 1. For clarity of illustration, FIG. 2 exaggerates the distance between the sub-pixel columns.

For example, as shown in FIG. 2, the first data line D1 and the fifth data line D5 are two adjacent data lines, and are respectively located on both sides of the second sub-pixel column P2. The second data line D2 and the fourth data line D4 are two adjacent data lines, and are respectively located on both sides of the third sub-pixel column P3. For the second sub-pixel column P2, the first data line D1 and each of the respective sub-pixels in the second sub-pixel column P2 form a first coupling capacitor C1, and the fifth data line D5 and each of the respective sub-pixels in the second sub-pixel column P2 form a second coupling capacitor C2.

For the third sub-pixel column P3, the fourth data line D4 and each of the respective sub-pixels in the third sub-pixel column P3 form a third coupling capacitor C3, and the second data line D2 and each of the respective sub-pixels in the third sub-pixel column P3 form a fourth coupling capacitor C4. Because the distance from the second sub-pixel column P2 to the fifth data line D5 is the first distance d1, the distance from the third sub-pixel column P3 to the fourth data line D4 is the fourth distance d4, and the first distance d1 is smaller than the second distance d2, the fourth distance d4 is smaller than the third distance d3. According to the calculation formula of the capacitance (i.e., $C=\xi S/4\pi kd$, where $\varepsilon$ is a constant, S is a positive facing area of the capacitor plates, d is a distance between the capacitor plates, and k is an electrostatic force constant), a capacitance value of the first coupling capacitor C1 is smaller than a capacitance value of the second coupling capacitor C2, and a capacitance value of the third coupling capacitor C3 is greater than a capacitance value of the fourth coupling capacitor C4.

For example, the fourth data line D4 and the fifth data line D5 are also two adjacent data lines. In the embodiments of the present disclosure, in the case where the polarity inversion mode of the touch display panel is the column inversion, in a certain frame, a data signal on the first data line D1 is a positive signal, a data signal on the fifth data line D5 is a negative signal, data signals on the respective sub-pixels in the second sub-pixel column P2 are negative signals, a data signal on the fourth data line D4 is a positive signal, a data signal on the second data line D2 is a negative signal, and data signals on the respective sub-pixels in the third sub-pixel column P3 are negative signals. Due to the pull of the data signals on the respective sub-pixels in the second sub-pixel column P2 by the first coupling capacitor C1, the data signals on the respective sub-pixels in the second sub-pixel column P2 are shifted toward the positive signal (i.e., the polarity of the positive signal is opposite to the polarities of the data signals on the respective sub-pixels in the second sub-pixel column P2). That is, if the data signal of the first color sub-pixel R in the second sub-pixel column P2 is −5V, due to the pull of the data signal on the first color sub-pixel R in the second sub-pixel column P2 by the first coupling capacitor C1, the amount of change of the data signal on the first color sub-pixel R in the second sub-pixel column P2 may be 0.1V (i.e., the data signal changes from −5V to −4.9V). In contrast, due to the pull of the data signals on the respective sub-pixels in the second sub-pixel column P2 by the second coupling capacitor C2, the data signals on the respective sub-pixels in the second sub-pixel column P2 are shifted toward the negative signal (i.e., the polarity of the negative signal is the same as the polarities of the data signals on the respective sub-pixels in the second sub-pixel column P2). That is, if the data signal of the first color sub-pixel R in the second sub-pixel column P2 is −5V, due to the pull of the data signal on the first color sub-pixel R in the second sub-pixel column P2 by the second coupling capacitor C2, the amount of change of the data signal on the first color sub-pixel R in the second sub-pixel column P2 may be −0.2V (i.e., the data signal changes from −5V to −5.2V). In summary, due to the pull of the data signals on the respective sub-pixels in the second sub-pixel column P2 by the first coupling capacitor C1 is smaller than the pull of the data signals on the respective sub-pixels in the second sub-pixel column P2 by the second coupling capacitor C2, for example, the data signal on the first color sub-pixel R in the second sub-pixel column P2 may become −5.1V. Because the coupling pull of the data signals on the respective sub-pixels in the second sub-pixel column P2 by the fifth data line D5 is relatively strong, in this case, the data signals of the respective sub-pixels in the second sub-pixel column P2 are increased (for example, the data signal on the first color sub-pixel R is changed from −5V to −5.1V), so that the brightness of each of the respective sub-pixels in the second sub-pixel column P2 is increased. Accordingly, because the pull of the data signals on the respective sub-pixels in the third sub-pixel column P3 by the third coupling capacitor C3 is greater than the pull of the data signals on the respective sub-pixels in the third sub-pixel column P3 by the fourth coupling capacitor C4, the data signals of the respective sub-pixels in the third sub-pixel column P3 are lowered, so that the brightness of each of the respective sub-pixels in the third sub-pixel column P3 is lowered.

In summary, due to the influence of the coupling capacitors between the data lines and the pixels, the brightness of the respective sub-pixels in the second sub-pixel column P2 is relatively high, the brightness of the respective sub-pixels in the third sub-pixel column P3 is relatively low, and the difference in color and brightness between the respective sub-pixels in the second sub-pixel columns P2 and the corresponding respective sub-pixels in the third sub-pixel column P3 may be mutually neutralized. That is, the difference in color and brightness between the first color sub-pixel R in the second sub-pixel column P2 and the first color sub-pixel R in the third sub-pixel column P3 may be mutually neutralized, the difference in color and brightness between the second color sub-pixel G in the second sub-pixel column P2 and the second color sub-pixel G in the third sub-pixel column P3 may be mutually neutralized, and the difference in color and brightness between the third color sub-pixel B in the second sub-pixel column P2 and the third color sub-pixel B in the third sub-pixel column P3 may be mutually neutralized, thereby ameliorating the difference in color and brightness between the front end and the rear end of the display panel in the scanning direction, and improving the display quality.

For example, due to the pull by the first coupling capacitor C1 and the pull by the second coupling capacitor C2, the amount of change of the data signal on each of the sub-pixels in the second sub-pixel column P2 is $\Delta U1$. Due to the pull by the third coupling capacitor C3 and the pull by the fourth coupling capacitor C4, the amount of change in the data signal on each of the sub-pixels in the third sub-pixel column P3 is $\Delta U2$. In a case where the first distance d1 and the fourth distance d4 are equal, and the second distance d2 and the third distance d3 are also equal, in the case of the same data signal, the capacitance value of the second coupling capacitor C2 and the capacitance value of the third coupling capacitor C3 may be equal, and the capacitance value of the first coupling capacitor C1 and the capacitance value of the fourth coupling capacitor C4 may also be equal, so that an absolute value of $\Delta U1$ and an absolute value of $\Delta U2$ can be substantially the same, thereby better ameliorating the difference in color and brightness of the front end and the rear end of the display panel.

For example, as shown in FIG. 1, a distance from the first touch line T1 to the first sub-pixel column P1 located on the left side of the first touch line T1 may be a first touch distance b1, and a distance from the first touch line T1 to the second sub-pixel column P2 located on the right side of the second sub-pixel column P2 may be a second touch distance b2, the first touch distance b1 is equal to the second distance d2 (b1=d2), and the second touch distance b2 is equal to the first distance d1 (b2=d1). In the example shown in FIG. 1, the first touch line T1 and the second touch line T2 can be symmetrically disposed with respect to the fifth sub-pixel column P5, thereby simplifying the arrangement of the signal lines on the display panel. Because the touch lines and the data lines can be prepared by using a mask, if the first touch distance b1 is equal to the second distance d2, and the second touch distance b2 is equal to the first distance d1, the design of the mask can be made simpler and easier to manufacture.

For example, a distance from the second touch line T2 to the third sub-pixel column P3 located on the left side of the second touch line T2 may be a third touch distance b3, and a distance from the second touch line T2 to the fourth sub-pixel column P4 located on the right side of the second touch line T2 may be a fourth touch distance b4, the third touch distance b3 is equal to the fourth distance d4 (b3=d4), and the fourth touch distance b4 is equal to the third distance d3 (b4=d3).

For example, three sub-pixel columns constitute one pixel column. As shown in FIG. 1, the first sub-pixel column P1, the second sub-pixel column P2, and the fifth sub-pixel column P5 constitute a first pixel column, and the third sub-pixel column P3, the fourth sub-pixel column P4, and the sixth sub-pixel column P6 constitute a second pixel column. For example, in the respective pixel columns, three sub-pixels located in the same row constitute one pixel. In the first sub-pixel row Q1, three sub-pixels of the first pixel column (for example, the first color sub-pixel R, the second color sub-pixel G, and the third color sub-pixel B located in the first sub-pixel row Q1 and sequentially arranged) constitute one pixel 10. Similarly, in the first sub-pixel row Q1, three sub-pixels of the second pixel column (for example, the first color sub-pixel R, the second color sub-pixel G, and the third color sub-pixel B located in the first sub-pixel row Q1 and sequentially arranged) constitute one pixel. For example, each pixel column corresponds to one touch line. As shown in FIG. 1, the first pixel column corresponds to the first touch line T1, and the second pixel column corresponds to the second touch line T2. For example, the first touch line T1 may correspond to the odd-numbered pixel columns, and the second touch line T2 may correspond to the even-numbered pixel columns.

It should be noted that, according to the actual design, in the touch display panel, a part of the touch lines may not be used to perform the touch detection function, that is, a part of the touch lines may not transmit the touch signals. Depending on the actual situation, a plurality of (such as, two, three, etc.) pixel columns may correspond to one touch line, and the present disclosure is not limited thereto.

For example, at least one sub-pixel column is provided between the first pair of adjacent sub-pixel columns 11 and the second pair of adjacent sub-pixel columns 12. As shown in FIG. 1, the fifth sub-pixel column P5 or the sixth sub-pixel column P6 may be provided between the first pair of adjacent sub-pixel columns 11 and the second pair of adjacent sub-pixel columns 12.

For example, as shown in FIG. 1, in some examples, the first pair of adjacent sub-pixel columns 11 and the fifth sub-pixel column P5 on the right side of the first pair of adjacent sub-pixel columns 11 constitute a first repeating block; the second pair of adjacent sub-pixel columns 12 and the sixth sub-pixel column P6 on the right side of the second pair of adjacent sub-pixel columns 12 constitute a second repeating block. As shown in FIG. 3A, in the row direction X of the sub-pixels, the first repeating block and the second repeating block may be sequentially arranged, and a plurality of first repeating blocks and a plurality of second repeating blocks are alternately arranged. In this way, in the row direction X, the first pair of adjacent sub-pixel columns 11 and the second pair of adjacent sub-pixel columns 12 can be alternately and evenly arranged sequentially, so that the display effect of the touch display panel can be more uniform.

For example, the arrangement of the respective sub-pixels of the fifth sub-pixel column P5 and the arrangement of the respective sub-pixels in the sixth sub-pixel column P6 are the same. As shown in FIG. 1, in the fifth sub-pixel column P5 and the sixth sub-pixel column P6, the arrangements of the sub-pixels are both BRGBRG.

For example, as shown in FIG. 3B, in some examples, the first pair of adjacent sub-pixel columns 11 and the fifth sub-pixel column P5 on the right side of the first pair of adjacent sub-pixel columns 11 constitute the first repeating block, and the second pair of adjacent sub-pixel columns 12 and the sixth sub-pixel column P6 on the right side of the second pair of adjacent sub-pixel columns 12 constitute the second repeating block. Two first repeating blocks constitute a first repeating block group, and two second repeating blocks constitute a second repeating block group. In the row direction X of the sub-pixels, a plurality of first repeating block groups and a plurality of second repeating block groups are alternately arranged.

It should be noted that, the arrangements of the first repeating blocks and the second repeating blocks shown in FIG. 3A and FIG. 3B are merely illustrative and not limiting. The specific arrangement of the first repeating blocks and the second repeating blocks may be designed according to actual needs. For example, a plurality of first repeating blocks (such as three, etc.) may constitute a first repeating block group, and a plurality of second repeating blocks (such as three, etc.) may constitute a second repeating block group. In the row direction X of the sub-pixels, a plurality of first repeating block groups and a plurality of second repeating block groups are alternately arranged. For another example, two first repeating blocks and one second repeating block may constitute one repeating block group, and a plurality of repeating block groups are sequentially arranged along the row direction X of the sub-pixels; In each of the repeating block groups, the two first repeating blocks and the one second repeating block are arranged along the row direction X of the sub-pixels, and the one second repeating block is located between the two first repeating blocks. Alternatively, one first repeating block and two second repeating blocks may constitute one repeating block group, and a plurality of repeating block groups are sequentially arranged along the row direction X of the sub-pixels; In each of the repeating block groups, the one first repeating block and the two second repeating blocks are arranged along the row direction X of the sub-pixels, and one the first repeating block is located between the two second repeating blocks.

Figure 4:
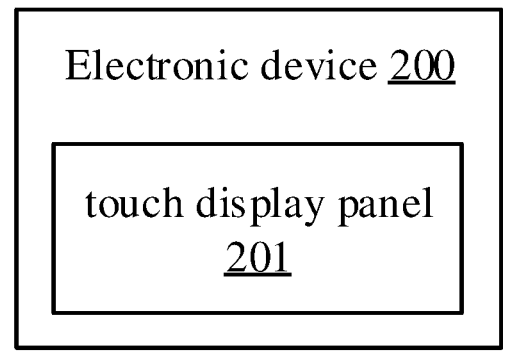
FIG. 4 is a schematic block diagram of an electronic device according to an embodiment of the present disclosure.

FIG. 4 is a schematic block diagram of an electronic device according to an embodiment of the present disclosure.

For example, as shown in FIG. 4, the electronic device 200 provided by the embodiment of the present disclosure includes any of the touch display panels 201 described above.

For example, the touch display panel 201 may be a liquid crystal display panel or the like. In a case where the touch display panel 201 is a liquid crystal display panel, the touch display panel 201 may include an array substrate and an opposite substrate. The sub-pixels, the data lines, the touch lines, and the like may be disposed on the array substrate. The first color sub-pixel R includes a first color filter, the second color sub-pixel G includes a second color filter, and the third color sub-pixel G includes a third color filter. The first color filter, the second color filter, and the third color filter may be disposed on the opposite substrate.

It should be noted that the touch display panel 201 may also be a display panel in a mode in which a white light organic light emitting diode (OLED) is combined with a color film.

For example, the first color filter may be a red filter, the second color filter may be a green filter, and the third color filter may be a blue filter.

For example, in some examples, the electronic device 200 may be any product or component having a display and touch function, such as a mobile phone, a tablet, a television, a display, a notebook, a digital photo frame, a navigator, and the like.

It should be noted that other components of the electronic device 200 (e.g., a control device, an image data encoding/decoding device, a line scan driver, a column scan driver, and a clock circuit, etc.) are understood by those of ordinary skill in the art, are not described herein, and should not intended to limit the present disclosure.

For the present disclosure, the following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and features in one embodiment or in different embodiments can be combined to obtain new embodiment(s).

The above are only the specific embodiments of the present disclosure, but the scope of the present disclosure is not limited thereto, and the scope of the present disclosure should be determined by the scope of the claims.

What is claimed is:

1. A touch display panel, comprising:
   a plurality of sub-pixels arranged in a matrix; and
   a plurality of data lines and a plurality of touch lines, each of the plurality of touch lines and each of the plurality of data lines being in a same layer and insulated from each other;
   wherein the plurality of data lines comprise a first data line and a second data line, the plurality of touch lines comprise a first touch line and a second touch line, the first data line and the first touch line are located between a first pair of adjacent sub-pixel columns, and the second data line and the second touch line are located between a second pair of adjacent sub-pixel columns;
   the first pair of adjacent sub-pixel columns comprises a first sub-pixel column and a second sub-pixel column, and the second pair of adjacent sub-pixel columns comprises a third sub-pixel column and a fourth sub-pixel column;
   the first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line;
   the first data line is connected to the second sub-pixel column, a distance from the second sub-pixel column to a data line located on a side of the second sub-pixel column away from the first data line is a first distance, a distance from the second sub-pixel column to the first data line is a second distance, and the first distance is smaller than the second distance;
   the second data line is connected to the fourth sub-pixel column, a distance from the third sub-pixel column to the second data line is a third distance, a distance from the third sub-pixel column to a data line which is connected to the third sub-pixel column and is located on a side of the third sub-pixel column away from the second data line is a fourth distance, and the third distance is greater than the fourth distance.

2. The touch display panel according to claim 1, wherein a distance from the first sub-pixel column to a data line which is connected to the first sub-pixel column and is located on a side of the first sub-pixel column away from the first data line is the first distance, and a distance from the first sub-pixel column to the first data line is the first distance; a distance from the fourth sub-pixel column to the second data line is the fourth distance, and a distance from the fourth sub-pixel column to a data line located on a side of the fourth sub-pixel column away from the second data line is the fourth distance.

3. The touch display panel according to claim 1, wherein a polarity inversion mode of the touch display panel is column inversion.

4. The touch display panel according to claim 1, wherein the first touch line is located on a side of the first data line away from the first sub-pixel column, and the second touch line is located on a side of the second data line away from the fourth sub-pixel column.

5. The touch display panel according to claim 1, wherein the plurality of touch lines comprise a plurality of first touch lines and a plurality of second touch lines, the plurality of first touch lines and the plurality of second touch lines are alternately arranged in the row direction of the plurality of sub-pixels.

6. The touch display panel according to claim 1, wherein the first distance is equal to the fourth distance, and the second distance is equal to the third distance.

7. The touch display panel according to claim 1, wherein the touch display panel comprises sub-pixels of a plurality of colors, and an arrangement of respective sub-pixels in the third sub-pixel column is identical to an arrangement of respective sub-pixels in the second sub-pixel column.

8. The touch display panel according to claim 7, wherein colors of respective sub-pixels located in a same column are identical, and colors of the respective sub-pixels in the second sub-pixel column are same as colors of the respective sub-pixels in the third sub-pixel column.

9. The touch display panel according to claim 1, wherein a sub-pixel in the first sub-pixel column and a sub-pixel in the third sub-pixel column which is in a same row as the sub-pixel in the first sub-pixel column have a same color, and
   a sub-pixel in the second sub-pixel column and a sub-pixel in the fourth sub-pixel column which is in a same row as the sub-pixel in the second sub-pixel column have a same color.

10. The touch display panel according to claim 9, wherein a sub-pixel in the first sub-pixel column and a sub-pixel in the second sub-pixel column which is in a same row as the sub-pixel in the first sub-pixel column have different colors, and a sub-pixel in the third sub-pixel column and a sub-pixel in the fourth sub-pixel column which is in a same row as the sub-pixel in the third sub-pixel column have different colors.

11. The touch display panel according to claim 1, wherein the touch display panel comprises sub-pixels of a plurality of colors, and
at least one sub-pixel is provided between two sub-pixels having a same color in a column direction of the plurality of sub-pixels, and a color of the at least one sub-pixel is different from the same color of the two sub-pixels.

12. The touch display panel according to claim 1, wherein the touch display panel comprises sub-pixels of a plurality of colors, and
at least one sub-pixel is provided between two sub-pixels having a same color in the row direction of the plurality of sub-pixels, wherein a color of the at least one sub-pixel is different from the same color of the two sub-pixels.

13. The touch display panel according to claim 1, wherein
a distance from the first touch line to the first sub-pixel column is equal to the second distance, and a distance from the first touch line to the second sub-pixel column is equal to the first distance;
a distance from the second touch line to the third sub-pixel column is equal to the fourth distance, and a distance from the second touch line to the fourth sub-pixel column is equal to the third distance.

14. The touch display panel according to claim 1, wherein at least one sub-pixel column is provided between the first pair of adjacent sub-pixel columns and the second pair of adjacent sub-pixel columns.

15. The touch display panel according to claim 1, wherein the first distance is equal to the fourth distance, the touch display panel further comprises two adjacent sub-pixel columns, only a data line is disposed between the two adjacent sub-pixel columns, and distances from the data line respectively to the two adjacent sub-pixel columns are the first distance.

16. An electronic device, comprising a touch display panel,
wherein the touch display panel comprises:
a plurality of sub-pixels arranged in a matrix; and
a plurality of data lines and a plurality of touch lines, each of the plurality of touch lines and each of the plurality of data lines being in a same layer and insulated from each other;
wherein the plurality of data lines comprise a first data line and a second data line, the plurality of touch lines comprise a first touch line and a second touch line, the first data line and the first touch line are located between a first pair of adjacent sub-pixel columns, and the second data line and the second touch line are located between a second pair of adjacent sub-pixel columns;
the first pair of adjacent sub-pixel columns comprises a first sub-pixel column and a second sub-pixel column, and the second pair of adjacent sub-pixel columns comprises a third sub-pixel column and a fourth sub-pixel column;
the first pair of adjacent sub-pixel columns and the second pair of adjacent sub-Pixel columns are arranged along a row direction of the plurality of sub-pixels, the first sub-pixel column is located on a side of the first data line away from the second date line, the fourth sub-pixel column is located on a side of the second data line away from the first data line, and the second sub-pixel column and the third sub-pixel column are located between the first data line and the second data line;
the first data line is connected to the second sub-pixel column, a distance from the second sub-pixel column to a data line located on a side of the second sub-pixel column away from the first data line is a first distance, a distance from the second sub-pixel column to the first data line is a second distance, and the first distance is smaller than the second distance;
the second data line is connected to the fourth sub-pixel column, a distance from the third sub-pixel column to the second data line is a third distance, a distance from the third sub-pixel column to a data line which is connected to the third sub-pixel column and is located on a side of the third sub-pixel column away from the second data line is a fourth distance, and the third distance is greater than the fourth distance.

17. A touch display panel, comprising:
a plurality of sub-pixels arranged in a matrix;
a plurality of data lines and a plurality of touch lines, each of the plurality of touch lines and each of the plurality of data lines being in a same layer and insulated from each other;
wherein the plurality of data lines comprise a first data line and a second data line, the plurality of touch lines comprise a first touch line and a second touch line, the first data line and the first touch line are located between a first pair of adjacent sub-pixel columns, and the second data line and the second touch line are located between a second pair of adjacent sub-pixel columns;
the first pair of adjacent sub-pixel columns comprises a first sub-pixel column and a second sub-pixel column, and the second pair of adjacent sub-pixel columns comprises a third sub-pixel column and a fourth sub-pixel column;
the first pair of adjacent sub-pixel columns and the second pair of adjacent sub-pixel columns are arranged along a row direction of the plurality of sub-pixels, the first sub-pixel column is located on a side of the first data line away from the second data line, the fourth sub-pixel column is located on a side of the second data line away from the first data line, and the second sub-pixel column and the third sub-pixel column are located between the first data line and the second data line;
the first data line is connected to the second sub-pixel column, a distance from the first sub-pixel column to the first data line is a first distance, a distance from the second sub-pixel column to the first data line is a second distance, and the first distance is smaller than the second distance;
the second data line is connected to the fourth sub-pixel column, a distance from the third sub-pixel column to the second data line is a third distance, a distance from the fourth sub-pixel column to the second data line is a fourth distance, and the third distance is greater than the fourth distance.

18. The touch display panel according to claim 17, wherein a distance from the first sub-pixel column to a data line which is connected to the first sub-pixel column and is located on a side of the first sub-pixel column away from the first data line is the first distance, and a distance from the second sub-pixel column to a data line located on a side of the second sub-pixel column away from the first data line is the first distance, a distance from the third sub-pixel column to a data line which is connected to the third sub-pixel column and is located on a side of the third sub-pixel column away from the second data line is the fourth distance, and a distance from the fourth sub-pixel column to a data line located on a side of the fourth sub-pixel column away from the second data line is the fourth distance.

19. The touch display panel according to claim 17, a distance from the first touch line to the first sub-pixel column is equal to the second distance, and a distance from the first touch line to the second sub-pixel column is equal to the first distance; a distance from the second touch line to the third sub-pixel column is equal to the fourth distance, and a distance from the second touch line to the fourth sub-pixel column is equal to the third distance.

20. An electronic device, comprising the touch display panel according to claim 17.

* * * * *